US006720569B1

(12) United States Patent
Johnson et al.

(10) Patent No.: US 6,720,569 B1
(45) Date of Patent: Apr. 13, 2004

(54) ELECTRO-OPTICAL DEVICE INCLUDING A FIELD EMISSION ARRAY AND PHOTOCONDUCTIVE LAYER

(75) Inventors: Scott V. Johnson, Scottsdale, AZ (US); James E. Jaskie, Scottsdale, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/437,777

(22) Filed: May 13, 2003

(51) Int. Cl.[7] .............................................. H01L 29/06

(52) U.S. Cl. .......................... 257/10; 257/84; 257/443; 315/169.1

(58) Field of Search ............................ 257/10, 11, 443, 257/444, 448, 458, 84; 315/169.1, 169.3, 169.4; 313/495, 309

(56) References Cited

U.S. PATENT DOCUMENTS 5,585,301 A * 12/1996 Lee et al. ..................... 438/20
5,734,223 A * 3/1998 Makishima et al. ........ 313/495
5,804,833 A * 9/1998 Stettner et al. ............... 257/10
6,031,336 A * 2/2000 Rumbaugh et al. ...... 315/169.3
6,034,810 A * 3/2000 Robinson et al. ........... 359/293
6,348,403 B1 * 2/2002 Raina et al. ................ 438/618
6,441,559 B1 * 8/2002 Yamamoto et al. ...... 315/169.1

* cited by examiner

*Primary Examiner*—Kevin M. Picardat
(74) *Attorney, Agent, or Firm*—William E. Koch

(57) ABSTRACT

An electro-optical device including a cathode plate, a plurality of emitters and an anode plate. The anode plate including a photoconductive layer formed on an interior surface and in alignment to receive emitter emissions. The device is characterized as matrix addressed according to an input signal. A varying video signal, in concert with the matrix scanning of the cathode, generates a video signal containing a scene imaged by the photoconductive layer of the anode plate.

31 Claims, 1 Drawing Sheet

ELECTRO-OPTICAL DEVICE INCLUDING A FIELD EMISSION ARRAY AND PHOTOCONDUCTIVE LAYER

FIELD OF THE INVENTION

The present invention pertains to the field of electro-optical devices including field emission devices and to a method for fabricating such devices.

BACKGROUND OF THE INVENTION

Photoconductive imaging devices, such as camera vacuum tubes and charge couple devices (CCDs) are well known in the imaging field. In general, a camera tube is an image pick-up tube that includes a photoconductive layer which acts as the photosensitive surface. A wide variety of camera tube types are manufactured, each having unique characteristics. Generally, the type of tube selected is based on the need to balance resolution, integration (lag) and contrast. All of these imaging devices have one thing in common, they require a vacuum tube imager to convert reflected light into electrical impulses.

This is accomplished by firing a steady stream of high-velocity electrons at the back side of a CRT-type imager. Vidicon camera tubes are the most well known type of camera tube and have been found to work best in environments where there is full, consistent light. Generally a Vidicon camera tube offers good resolution, moderate lag, and low image distortion. On the negative side, Vidicon camera tubes, and vacuum tubes utilized for imaging in general, are bulky and have a thermionic cathode.

CCD imaging devices on the other hand, are made using a semiconductor target instead of a vacuum tube. CCDs are typically designed to satisfactorily collect images in environments where the light level is low-to-full and somewhat variable. Each element in a CCD stores a charge that is determined by the illumination incident on it. At the end of the exposure interval, the charge is transferred to a storage register and the CCD is freed up for the next exposure. The charges in the storage register are transferred to the output stage serially during that time. The advantage that a CCD model realizes over that of a tube-type imaging devices lies in how the image scenes are formed. Because there is a semi-conductor instead of a tube in these devices, they are not susceptible to many of the same problems, such as bulkiness and image bloom. In addition, because CCDs generate less heat within them, the electronic components found inside last longer. Yet negative aspects to the CCD imaging device exist in the form of relatively low sensitivity to light and limited environmental capabilities.

In addition, field emission arrays (FEAs) have been known for many years. FEAs typically use a structure commonly known as a Spindt tip as an emitter or carbon nanotubes. FEAs further include an anode which collects electrons emitted by the emitters and is disposed within 200–5000 micrometers from a plurality of gate extraction electrodes positioned proximate the emitters. Field emission camera tubes have been reported, yet these devices fail to overcome the defects previously mentioned with regard to camera tubes and CCDs.

Accordingly, it is highly desirable to provide a device which overcomes these problems currently found with imaging devices and a method of fabricating the device. Thus, there exists a need for an improved imaging device which is simple to fabricate, compact, has a high light sensitivity, is simple to address, and has a potentially long life.

BRIEF DESCRIPTION OF THE DRAWINGS

Referring to the drawings.

DESCRIPTION OF THE PREFERRED EMBODIMENT

Figure 1:
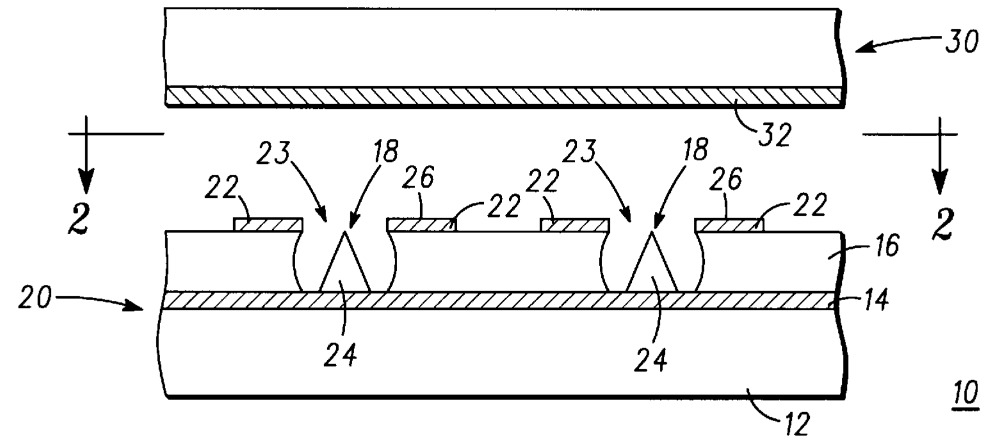
FIG. 1 is a sectional view of an embodiment of an electro-optical device in accordance with the present invention.
Figure 2:
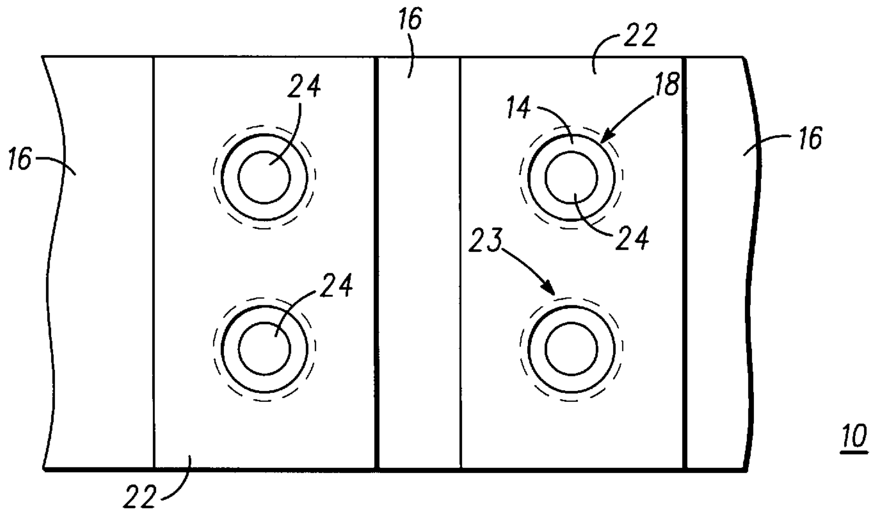
FIG. 2 is a sectional view, taken along lines 2—2 of the electro-optical device of FIG. 1.

Turning now to the figures and specifically to FIGS. 1 and 2, illustrated is an electro-optical device according to the present invention, referenced 10. Device 10 includes a cathode plate 20, an anode plate 30, and an optional spacer (described presently) disposed between cathode plate 10 and anode plate 20. Cathode plate 20 is generally comprised of a supporting substrate 12, a conductive layer 14 formed on an uppermost surface of supporting substrate 12, a dielectric layer 16 disposed on an upper (inner) surface of conductive layer 14, a gate metal layer 22 formed on an upper surface of dielectric layer 16 and a plurality of emitters 24.

Supporting substrate 12 is preferably formed of a non-conductive material such as glass or ceramic. While substrate 12 could be a semiconductor material, so as to integrate some control electronics into the electro-optical device, some insulating layers would be included to reduce any capacitance present. Conductive layer (or layers) 14 is then deposited on the surface of substrate 12 to form a base for an emitter (discussed presently). The conductive layer serves to act as a portion of a cathode in electro-optical device 10. Generally, conductive layer 14 includes a metal that will adhere well to the supporting substrate 12. Conductive layer 14 is preferably formed into an elongated strip (not shown) with an expanded portion defining the emitter area. The elongated strip provides external electrical connections to the emitter, as will be described in more detail presently. Also, when electro-optical device 10 is being fabricated in an array, a plurality of strips are formed in parallel spaced apart relationship (generally referred to as rows) and each strip has a plurality of expanded portions formed therein. Generally conductive layer 14 includes a metal, such as titanium, titanium tungsten, chromium, or the like, that will adhere well to substrate 12 and on which one or more emitters can be conveniently mounted.

Emitter 24 is positioned on conductive layer 14 and generally in a centrally located portion of the upper surface of the expanded area. In this preferred embodiment, emitter 25 includes a spindt tip emitter as illustrated, but anticipated by this disclosure is the inclusion of a plurality of high aspect ratio members, such as carbon nanotubes, carbon fibers, nanocoralline, crushed graphite, metallic threads, metal-insulator-metal, or the like, as emitter 25. In the instance where emitters 24 are formed as carbon nanotubes, distinct advantages over spindt tip emitters and thermionic emitters can be found in terms of lifetime and ruggedness of the emitters.

In this preferred embodiment, dielectric layer 16 is deposited so as to surround emitter 24. Dielectric layer 16 is formed with a depth and width that defines a gate separation from emitter 24, as will be explained in more detail. Dielectric layer 16 is preferably formed of silicon dioxide ($SiO_2$), magnesium oxide (MgO), etc. Dielectric layer 16 has formed therein at least one well 18, and as illustrated herein, typically a plurality of wells 18. The plurality of field emitters 24 are formed within wells 18 in dielectric layer 16. Gate metal layer 22 is formed on an uppermost surface of dielectric layer 16 and circumscribing field emitters 24. Gate metal layer 22 has formed therein a gate opening 23, thereby defining gate extraction electrode 26. Gate extraction electrode 26 is electrically separated from conductive layer 14 and surrounds emitter 24. Gate extraction electrode 26 is separated from emitter 24 by a substantially fixed distance.

Finally, anode plate 30 is disposed in spaced relation from gate extraction electrodes 26. In this preferred embodiment anode plate 30 is spaced approximately 250 μm to 1200 μm from substrate 12 of cathode 20. Cathode plate 20 and anode plate 30 are sealed around the edges and a vacuum of $10^{-6}$ tor or less is produced during sealing. In an alternative embodiment, a spacer (not shown) is disposed between cathode plate 20 and anode plate 30.

Anode plate 30 is typically formed of a non-conductive material such as glass or ceramic. Anode plate 30 has deposited on an interior surface 31, a photoconductive film 32 and is separated from emitter 20 by a substantially fixed distance. Photoconductive film 32 is designed to receive electrons emitted by the emitter 20. Photoconductive film 32 is disclosed in a preferred embodiment as being formed of cadmium telluride or zinc selenide. It should be understood that anticipated by this disclosure is the fabrication of photoconductive film 32 of alternate photoconductive materials known in the art. Photoconductive film 32 is deposited on surface 31 of anode plate 30 by any standard film deposition processes, such as chemical vapor deposition (CVD), sputtering, evaporation, or the like.

Cathode plate 20 and anode plate 30 are electrically conductive, and when appropriate potentials are applied thereto and to gate extraction electrode 26, electrons are caused to be emitted from the tips of field emitters 24. Electron extraction is initiated and controlled by the potential applied at gate extraction electrode 26. In order to limit power consumption, the distance between gate extraction electrode 26 and the emission tips of field emitters 24 is made very small, on the order of 0.1–1 micrometers. Typically, the height of dielectric layer 16 is on the order of 1 micrometer and is governed by processing considerations.

Figure 3:
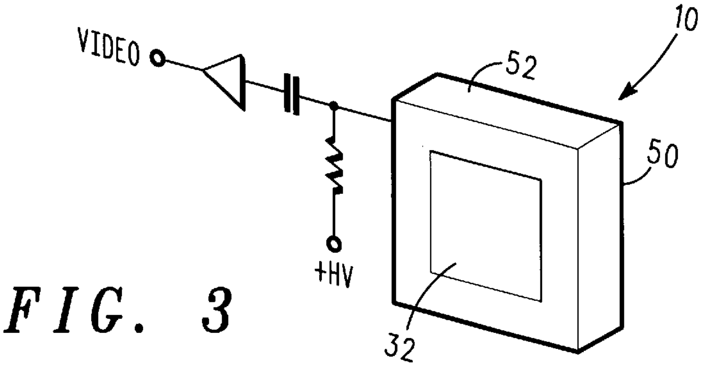
FIG. 3 is a schematic representation of the matrix addressing circuit application of an electro-optical device in accordance with the present invention.

During operation, and as illustrated in FIG. 3 by a simplified diagrammatical view, electro-optical device 10 is typically matrix addressed using row connections 50 and column connections 52, rather than raster addressed as is found in conventional vidicon devices. Signal pickoff is accomplished by a voltage drop across a high value resistor 54, similar to a vidicon. The voltage drop represents a varying video signal, that in concert with the matrix scanning of the cathode comprises a video signal containing the scene imaged by the photoconductive anode.

Thus, an electro-optical device is disclosed which greatly improves upon current imaging devices. In the preferred embodiment, the electro-optical device provides for a wide operating temperature range, a wide range of resolution, and robust planar construction. The addition of a photoconductive film to the anode structure provides for a device with low light sensitivity and low power consumption of a field emission array. Proposed use of the electrooptical device is within virtually any video camera application, including high resolution x-ray imaging.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A field emission electro-optical device comprising:

a supporting substrate;

a conductive layer positioned on the supporting substrate;

an emitter positioned on the layer of conductive material;

a gate metal layer electrically separated from the conductive layer and surrounding the emitter, the gate metal layer separated from the emitter by a substantially fixed distance and defining a gate opening through the metal gate metal layer overlying the emitter;

an anode plate positioned in spaced relationship to the gate metal layer; and a photoconductive film deposited on an interior major surface of the anode plate and separated from the emitter by a substantially fixed distance, the photoconductive film designed to receive electrons emitted by the emitter.

2. A field emission electro-optical device as claimed in claim 1 wherein the supporting substrate is formed of a non-conductive material.

3. A field emission electro-optical device as claimed in claim 1 wherein the conductive layer includes material that adheres to the supporting substrate.

4. A field emission electro-optical device as claimed in claim 3 wherein the conductive layer is formed of at least one of titanium, titanium tungsten, or chromium.

5. A field emission electro-optical device as claimed in claim 4 wherein the conductive layer is formed as a plurality of conductive strips positioned on the supporting substrate in parallel spaced apart relationship.

6. A field emission electro-optical device as claimed in claim 5 wherein the plurality of emitters are positioned on the plurality of conductive strips.

7. A field emission electro-optical device as claimed in claim 1 wherein the gate metal layer includes one of copper, nickel, and gold.

8. A field emission electro-optical device as claimed in claim 1 wherein gate metal layer includes a plated gate metal.

9. A field emission electro-optical device as claimed in claim 1 wherein the emitters positioned on the conductive layer include a plurality of high aspect ratio members.

10. A field emission electro-optical device as claimed in claim 9 wherein the plurality of high aspect ratio members include one of nanotubes, carbon fibers, nanocoralline, crushed graphite, and metallic threads.

11. A field emission electro-optical device as claimed in claim 1 wherein the emitter positioned on the conductive layer include Spindt tip emitters.

12. A field emission electro-optical device as claimed in claim 1 further including a dielectric material separating the conductive layer and the gate metal layer.

13. A field emission electro-optical device as claimed in claim 1 wherein the photoconductive layer is formed of cadmium telluride.

14. A field emission electro-optical device as claimed in claim 1 wherein the photoconductive layer is formed of zinc selenide.

15. A field emission electro-optical device as claimed in claim 1 wherein the device is matrix addressed.

16. A field emission electro-optical device comprising:

a supporting substrate;

a conductive layer formed as a plurality of conductive strips positioned on the supporting substrate in parallel spaced apart relationship;

a dielectric layer positioned on an uppermost surface of the conductive layer and having at least one well formed therein;

an emitter positioned on the layer of conductive material and within the at least one well and on the plurality of conductive strips;

a gate metal layer electrically separated from the conductive layer and surrounding the emitters, the gate metal layer separated from the emitters by a substantially fixed distance and defining a gate opening through the metal gate metal layer overlying the emitters;

an anode plate positioned in spaced relationship to the gate metal layer;

and a photoconductive film deposited on an interior major surface of the anode plate and separated from the emitters by a substantially fixed distance, the photoconductive film designed to receive electrons emitted by the emitters.

17. A field emission electro-optical device as claimed in claim 16 wherein the supporting substrate is formed of a non-conductive material.

18. A field emission electro-optical device as claimed in claim 16 wherein the conductive layer is formed of at least one of titanium, titanium tungsten, or chromium.

19. A field emission electro-optical device as claimed in claim 16 wherein the gate metal layer includes one of copper, nickel, and gold.

20. A field emission electro-optical device as claimed in claim 16 wherein gate metal layer includes a plated gate metal.

21. A field emission electro-optical device as claimed in claim 16 wherein the emitters positioned on the plurality of conductive strips include a plurality of high aspect ratio members.

22. A field emission electro-optical device as claimed in claim 21 wherein the plurality of high aspect ratio members include one of nanotubes, carbon fibers, nanocoralline, crushed graphite, and metallic threads.

23. A field emission electro-optical device as claimed in claim 16 wherein the emitters positioned on the plurality of conductive strips include Spindt tip emitters.

24. A field emission electro-optical device as claimed in claim 16 wherein the photoconductive layer is formed of one of cadmium telluride or zinc selenide.

25. A field emission electro-optical device as claimed in claim 16 wherein the device is matrix addressed.

26. A field emission electro-optical device comprising:

a supporting substrate formed of a non-conductive material;

a conductive layer formed as a plurality of conductive strips positioned on the supporting substrate in parallel spaced apart relationship;

a plurality of emitters positioned on the plurality of conductive strips;

a gate metal layer electrically separated from the conductive layer and surrounding the emitters, the gate metal layer separated from the emitters by a substantially fixed distance and defining a gate opening through the metal gate layer overlying the emitters;

a dielectric material separating the conductive layer and the gate metal layer;

an anode plate positioned in spaced relationship to the gate metal layer; and a photoconductive film formed of one of cadmium telluride or zinc selenide deposited on an interior major surface of the anode plate and separated from the emitters by a substantially fixed distance, the photoconductive film designed to receive electrons emitted by the emitters.

27. A field emission electro-optical device as claimed in claim 26 wherein the conductive layer is formed of at least one of titanium, titanium tungsten, or chromium.

28. A field emission electro-optical device as claimed in claim 26 wherein the gate metal layer includes one of copper, nickel, and gold.

29. A field emission electro-optical device as claimed in claim 26 wherein the emitters positioned on the plurality of conductive strips include a plurality of high aspect ratio members including one of nanotubes, carbon fibers, nanocoralline, crushed graphite, and metallic threads.

30. A field emission electro-optical device as claimed in claim 26 wherein the emitters positioned on the plurality of conductive strips include Spindt tip emitters.

31. A field emission electro-optical device as claimed in claim 26 wherein the device is matrix addressed.

* * * * *